US006410950B1

United States Patent
Sittig et al.

(10) Patent No.: US 6,410,950 B1
(45) Date of Patent: Jun. 25, 2002

(54) GEOMETRICALLY COUPLED FIELD-CONTROLLED-INJECTION DIODE, VOLTAGE LIMITER AND FREEWHEELING DIODE HAVING THE GEOMETRICALLY COUPLED FIELD-CONTROLLED-INJECTION DIODE

(75) Inventors: Roland Sittig, Braunschweig; Karim-Thomas Taghizadeh-Kaschani, Unterhaching, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/055,794

(22) Filed: Apr. 6, 1998

(30) Foreign Application Priority Data

Apr. 4, 1997 (DE) .......................................... 197 13 980

(51) Int. Cl.[7] ........................ H01L 29/861; H01L 29/00; H01L 31/107; H01L 23/58
(52) U.S. Cl. ........................ 257/267; 257/655; 257/133; 257/605; 257/606; 257/483; 257/484; 257/492; 257/493; 257/495; 257/170; 257/173; 257/134; 257/138; 257/347; 257/105
(58) Field of Search ................................ 257/247, 483, 257/484, 605, 626, 105, 106, 481, 551, 603, 492, 493, 495, 170, 723, 133, 138, 137, 134, 147, 347, 349–351, 354, 655

(56) References Cited

U.S. PATENT DOCUMENTS

| 3,493,821 A | | 2/1970 | Bittmann | |
| 4,201,604 A | | 5/1980 | Bierig et al. | |
| 4,656,366 A | * | 4/1987 | Davis et al. | 307/252 |
| 5,500,541 A | * | 3/1996 | Terashima et al. | 257/105 |
| 5,608,244 A | * | 3/1997 | Takahashi | 257/267 |
| 5,631,493 A | * | 5/1997 | Pezzani | 257/551 |
| 5,914,503 A | * | 6/1999 | Iwamuro et al. | 257/133 |
| 5,923,067 A | * | 7/1999 | Voldman | 257/349 |
| 5,969,400 A | * | 10/1999 | Shinohe et al. | 257/492 |
| 5,977,569 A | * | 11/1999 | Li | 257/119 |
| 6,049,109 A | * | 4/2000 | Omura et al. | 257/347 |
| 6,091,087 A | * | 7/2000 | Iwamuro et al. | 257/133 |
| 6,097,068 A | * | 8/2000 | Brown et al. | 257/371 |
| 6,225,664 B1 | * | 5/2001 | Endo et al. | 257/347 |

FOREIGN PATENT DOCUMENTS

JP 11-026779 * 1/1999

OTHER PUBLICATIONS

"How to avoid TRAPATT Oscillations at the Reverse–Recovery of Power Diodes", K.T. Kaschani et al., Institut für Elektrophysik, Technische Universität Braunschweig, Germany, pp. 571–574.

(List continued on next page.)

Primary Examiner—Alexander O. Williams
(74) Attorney, Agent, or Firm—Laurence A. Greenberg; Werner H. Stemer; Ralph E. Locher

(57) ABSTRACT

A pin diode includes an inner zone, a cathode zone and an anode zone. A boundary surface between the inner zone and the anode zone is at least partly curved and/or at least one floating region having the same conduction type and a higher dopant concentration than in the inner zone is provided in the inner zone. The turnoff performance in such geometrically coupled power diodes, in contrast to the turnoff performance of pin power diodes (in the Read-diode version) with spaced charge coupling, is largely temperature-independent. Hybrid diodes with optimized conducting-state and turnoff performance can be made from such FCI diodes. FCI diodes are preferably used in conjunction with switching power semiconductor elements, as voltage limiters or free running diodes.

59 Claims, 2 Drawing Sheets

OTHER PUBLICATIONS

"Aktuelle Entwicklungen bei schnell schaltendedn Leistungsdioden", F. Kaussen et al., 39. ETG–Bericht, VDE Verlag, Bad Nauheim, 1992, pp. 25–40.

Japanese Patent Abstract No. 6–140642 (Yamada), dated May 20, 1995.

Patent Abstracts of Japan No. 57028367 (Shigenari), dated Feb. 16, 1982.

Patent Abstracts of Japan No. 56058274 (Takemi), dated May 21, 1981.

K.T. Kaschani, "How to avoid TRAPATT Oscillations at the Reverse–Recovery of Power Diodes", 1995 International Semiconductor Conference, pp. 571–574.

F. Kaussen, "Aktuelle Entwicklungen Bei Schnell Schltenden Leistungsdioden", VDE–Verlag GmbH, Berlin, Germany, topical developments in rapidly switching power diodes, pp. 25–40.

* cited by examiner

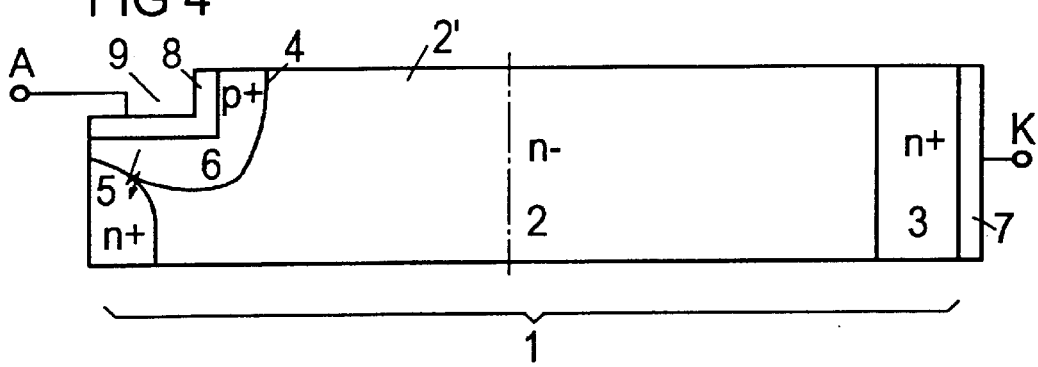
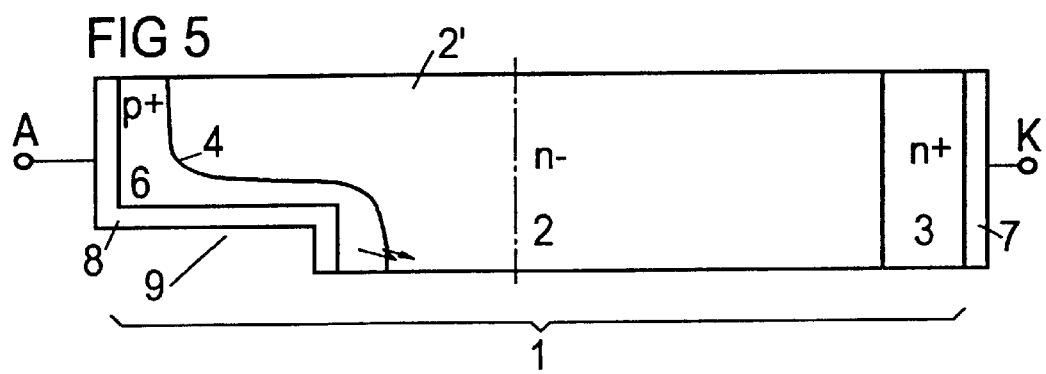
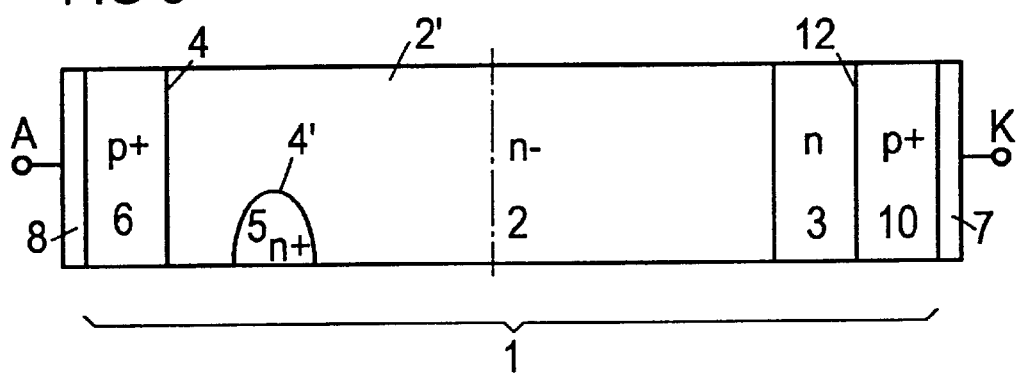
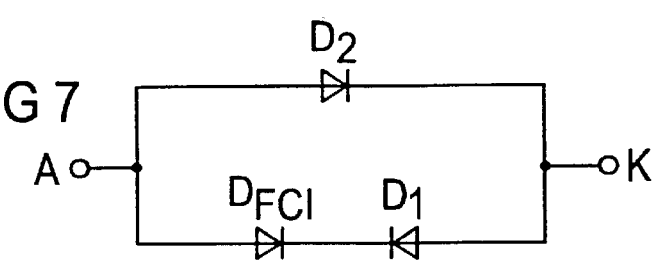

GEOMETRICALLY COUPLED FIELD-CONTROLLED-INJECTION DIODE, VOLTAGE LIMITER AND FREEWHEELING DIODE HAVING THE GEOMETRICALLY COUPLED FIELD-CONTROLLED-INJECTION DIODE

BACKGROUND OF THE INVENTION

1. Field of the Invention

The invention relates to a power diode including a semiconductor body having an inner zone of a first conduction type, a cathode zone of the first conduction type adjoining the inner zone and having a higher dopant concentration than in the inner zone, and an anode zone of a second conduction type adjoining the inner zone and having a higher dopant concentration than in the inner zone. The invention also relates to a method of producing the power diode as well as to a hybrid diode, a voltage limiter and a freewheeling diode having the power diode.

Such power diodes, also known as pin diodes, have long been known and have been described at length, for instance, by F. Kaussen and H. Schlangenotto in a paper entitled "Aktuelle Entwicklungen bei schnellschaltenden Leistungsdioden" [Current Developments in Fast-Switching Power Diodes], 39. ETG-Fachbericht, VDE Verlag, pp. 25–40, Bad Nauheim, 1992.

An FCI (Field-Controlled-Injection) diode of the type referred to at the outset is known, for instance, as a Read-diode and is described by K. T. Kaschani and R. Sittig in a paper entitled "How to Avoid TRAPATT Oscillations at the Reverse Recovery of Power Diodes", CAS '95, pp. 571–574, Sinaia, 1995. The subject matter of that publication is hereby expressly incorporated by reference into the present application.

The Read-diode was originally developed as a high-frequency component for generating IMPATT oscillations. The FCI concept is explained below in conjunction with FIG. 1, in terms of the known Read-diode in its special embodiment as a pin power diode. The coupling of the electrical fields of the high field zone and the low field zone, in such a pin power diode is effected through the space charge of the coupling zone. However, the space charge coupling has proved to be difficult to handle for the turnoff of power diodes, since as a rule the space charge coupling is very strongly temperature-dependent. It is accordingly difficult to use such pin power diodes in practice.

SUMMARY OF THE INVENTION

It is accordingly an object of the invention to provide a power diode, a method of producing the power diode and a hybrid diode, a voltage limiter and a freewheeling diode having the power diode, which overcome the hereinafore-mentioned disadvantages of the heretofore-known devices and methods of this general type and which provide novel FCI diodes in which a high field zone is coupled to a low field zone virtually independently of temperature.

With the foregoing and other objects in view there is provided, in accordance with the invention, a power diode, comprising a semiconductor body having an inner zone of a first conduction type; a cathode zone of the first conduction type, the cathode zone adjoining the inner zone and having a higher dopant concentration than in the inner zone; an anode zone of a second conduction type, the anode zone adjoining the inner zone and having a higher dopant concentration than in the inner zone; and the inner zone and the anode zone define an at least partly curved boundary surface therebetween and/or at least one floating region of the first conduction type is disposed in the inner zone.

In the first embodiment of the invention, the boundary surface between the inner zone and anode zone is curved. Due to this provision, a sharply localized disproportionate field increase is brought about, that is appropriate for the provision of a high field zone and a low field zone, which in that case are not space charge coupled and thus are not sharply temperature-dependent.

In the second embodiment of the invention, at least one region that floats with regard to the potentials and is of the same conduction type as in the inner zone, is located in the inner zone. Due to the introduction of such floating regions, which are typically doped very much more strongly than the inner zone itself, equipotential zones in the inner zone are provided, which cause a disruption of the electrical field and thus effect a sharply localized disproportionate field increase in certain areas. This sharply localized disproportionate field increase in turn brings about the creation of a local high field zone and a low field zone, which in that case are again not space charge coupled and thus are again not subject to severe temperature dependency.

Such power diodes will be referred to below as FCI diodes with geometric coupling.

Pin power diodes with geometric coupling have the advantage, over pin power diodes with space charge coupling, that the turnoff operation proceeds largely independently of temperature.

In addition, geometrically coupled FCI diodes in contrast to the conventional pin diodes have an active, controlled overvoltage limitation, which is largely independent of the storage charge, turnoff speed, and rated service life, which leads to no significant influence on the conducting-state, off-state and turn-on performance, and which furthermore also allows a pronounced reduction in switching losses.

In accordance with another feature of the invention, the at least one floating region has a higher dopant concentration than the inner zone.

In accordance with a further feature of the invention, the inner zone has an anode-side area, and the at least one floating region is disposed in the anode-side area.

In accordance with an added feature of the invention, the floating regions at least partly border on the anode zone.

This assures that the voltage breakdown will occur directly at the pn junction between the anode zone and the floating region.

In accordance with a further feature of the invention, the boundary surface between the inner zone and the floating region is likewise curved. Once again, this causes a disruption of the electrical field and thus a sharply localized disproportionate field increase in these areas. Thus the high field and low field are locally separated by these provisions as well.

In accordance with an added feature of the invention, since the floating regions act like a short circuit in terms of their conduction property, they can also be constructed of conductive material.

In accordance with an additional feature of the invention, very highly doped silicon is used as the conductive material, because of its good conductivity and its simple handling in terms of process technology. However, other conductive materials are also conceivable, such as metals or metal silicides.

In accordance with yet another feature of the invention, there is provided a further zone for producing a second pn junction which may be provided on the anode side or the cathode side. Typically, this zone has a higher dopant concentration than the adjoining anode zone or cathode zone. In this way, a series circuit of a geometrically coupled FCI diode and a further diode connected to it in the off-state direction can be produced. Through the use of this monolithically integrated, anti-parallel diode series circuit, the conducting-state mode of the FCI diode can be suppressed, so that it then functions only as a pure voltage limiter.

Due to the parallel connection of a further diode, an FCI hybrid diode array can be made therefrom, and in it in the conducting-state mode, only the further diode is relevant, while in the off-state mode only the FCI diode is relevant. If the further diode is a component with optimized conducting-state performance, then in this way it is possible simultaneously both to minimize the conducting-state and switching losses and to optimize the turnoff course.

With the objects of the invention in view, there is also provided a method for producing a power diode, which comprises producing an inner zone of a first conduction type in a semiconductor body having an anode side and a cathode side; producing a cathode zone of the first conduction type in the semiconductor body, the cathode zone adjoining the inner zone and having a higher dopant concentration than in the inner zone; producing an anode zone of a second conduction type in the semiconductor body, the anode zone adjoining the inner zone and having a higher dopant concentration than in the inner zone; etching trenches into the semiconductor body on the anode side; and subsequently introducing areas of the anode zone with an at least partly curved boundary surface at the inner zone into the semiconductor body by diffusion and/or ion implantation, and/or introducing at least one floating region of the first conduction type in the inner zone, by diffusion and/or ion implantation.

In a preferred production method for the areas of the anode zone with a curved pn junction and of the floating regions in the inner zone, the trenches are advantageously initially etched into the surface of the semiconductor body on the anode side. Next, after suitable masking of the surfaces of the semiconductor body, the desired areas of the anode zone, or the floating regions, can be introduced. Typically, the doping is introduced through the use of a masked diffusion or ion implantation. Subsequently, the trenches can be filled up again, for instance by CVD, and planarized.

In accordance with another feature of the invention, the FCI diodes are constructed as simple Read-diodes. This is possible whenever the dopant concentration of the cathode zone is selected to be quite high. In this way, it is possible to virtually entirely compensate for the temperature dependency of the breakdown voltage. Typically, the cathode zone has a dopant concentration of approximately $10^{17}$ cm$^{-3}$. However, the prerequisite for this is a markedly higher doped anode zone.

In accordance with a further feature of the invention, geometrically coupled power diodes are used highly advantageously as voltage limiters to suppress transient overvoltages. Currently available transient voltage suppressors (TVSs) of this kind are limited to voltages $\leq 500$ V. Other comparable components, such as varistors, do not respond fast enough and do not withstand the losses attendant on rapidly recurring voltage peaks, or age faster than desired. Moreover, voltage suppressors for voltages higher than 500 V can be furnished with the diodes of the invention.

In accordance with an added feature of the invention, the FCI diodes are also used as freewheeling diodes for power semiconductor components which are, for instance, connected parallel to bipolar transistors, MOSFETs, IGBTs, GTOs, thyristors, or MCTs, etc.

In accordance with a concomitant feature of the invention, there is provided a power semiconductor component connected parallel to the power diode.

The most critical operating state of a power diode of the type referred to at the outset is the turnoff, that is the change from the conducting-state to the off-state mode. In the turnoff, the storage charge required for conductivity modulation of the inner zone in the conducting-state mode must be removed again in a very brief time so that off-state voltage can be subsequently picked up. This is carried out through a so-called reverse current, which is automatically established upon the change to the off-state mode.

However, in practice, because of the influence of unavoidable stray inductance, a power diode can be turned off only with finite steepness. In order to avoid high inductive overvoltages as well as oscillations, a power diode should have the gentlest possible turnoff performance, which is known as soft recovery performance. This term is understood to mean a reverse current that fades gently after reaching the reverse current peak.

The turnoff performance of a power diode after reaching the reverse current peak is defined by the necessity of again completely discharging the stray inductance that has been charged to the maximum reverse current. In order to keep the attendant losses in the diode as slight as possible, this discharge operation should proceed as far as possible. However, at the same time a soft recovery must be sought after. This dictates a limitation in the attendant inductive overvoltages and the avoidance of any oscillation whatsoever, since oscillation can cause the impairment and even destruction of adjacent components or of the power diode itself.

However, limiting the overvoltage necessarily results in a slower discharge of the stray inductance and thus an increase in switching losses, so that in conjunction with minimizing overvoltages and switching losses, a fundamental question of a compromise arises. Nevertheless, the possibility does exist of optimizing the switching losses within the context of this compromise, for a given maximum overvoltage, by varying the course of the current or voltage.

The provisions for assuring the soft recovery performance can be classified as internal and external provisions, depending on the starting point.

External provisions pertain to corresponding modifications of the surrounding network of the power diode or its triggering. This includes, for instance, the connection of the power diode to a so-called "snubber", that is a series circuit including a resistor and a capacitor. The intent is to damp the turnoff performance. However, a snubber always needs increased switching losses, a larger volume and weight of the application device, and finally higher costs.

Another way, which is currently taken, to relieve power diodes and to assure a soft recovery, is to choke the switching speeds of the semiconductor switches involved and thus damp the turnoff behavior. This would be equivalent to initiating the turnoff operation through the use of a controllable resistor instead of an ideal switch. In this way, the occurrence of any overvoltage whatsoever can indeed be avoided, thus appreciably relieving the respective power diodes. At the same time, however, the switching losses in the semiconductor switches involved increase sharply.

Internal provisions essentially involve corresponding interventions into the structure of power diodes. These interventions pertain essentially to optimizing the dopant profile or the rated service life. The turnoff behavior of a power diode, in the case of the external provisions described, is determined definitively by other components. As a rule, this always leads to increased switching losses. Moreover, under these circumstances, only limited optimization of the power diode is possible. As a result, the present invention focuses exclusively on optimizing the diode structure.

Typically, the attempt is made to achieve a soft recovery by enlarging the inner zone and furnishing an additional charge carrier reservoir that is already provided in the conducting-state mode. However, in the corresponding diodes this leads to inner zone widths that are disproportionately great with regard to the allowable off-state voltage. This over-dimensioning increases the conducting-state voltages, or switching losses.

Moreover, proceeding in this way does not assure that the charge carrier reservoir provided in the conducting-state mode will in fact meet the requirements of the turnoff operation. If the charge carrier reservoir is too small, the reverse current is thus disrupted by the influence of the stray inductances, leading to increased overvoltages and undesired oscillations caused by the inductance. Conversely, if the charge carrier reservoir is too large, the result is correspondingly slowly fading reverse currents, so-called "tail currents", and thus increased switching losses.

One alternative is to limit inductive overvoltages during the turnoff operation through the use of a targeted generation of charge carriers and thus controlled discharge of the stray inductance as soon as a certain off-state voltage is exceeded. This concept is known as field-controlled injection, or FCI for short. The mechanism for generating the requisite charge carrier is impact ionization, which already sets an upper limit to the off-state capacity of a power diode.

Charge carriers are generated as needed by the FCI concept, automatically leading to a soft recovery. However, the prerequisite is a sharply localized generation of charge carriers, because otherwise TRAPATT oscillation can arise.

The fundamental advantage of the FCI concept is that it does not require overdimensioning of the inner zone. Conducting-state and switching losses can thus be markedly reduced, as compared with the power diodes of the type referred to at the outset.

Other features which are considered as characteristic for the invention are set forth in the appended claims.

Although the invention is illustrated and described herein as embodied in a power diode, a method of producing the power diode and a hybrid diode, a voltage limiter and a freewheeling diode having the power diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a cross-sectional view showing a third exemplary embodiment of a geometrically coupled FCI diode;

FIG. 5 is a cross-sectional view showing a fourth exemplary embodiment of a geometrically coupled FCI diode;

FIG. 6 is a cross-sectional view through the semiconductor body of a geometrically coupled FCI diode corresponding to FIG. 2, with an off-state diode integrated on the cathode side; and FIG. 7 is a circuit diagram of an FCI hybrid diode, illustrating a preferred use of an FCI diode with geometric coupling.

DESCRIPTION OF THE PREFERRED EMBODIMENTS

Figure 1:
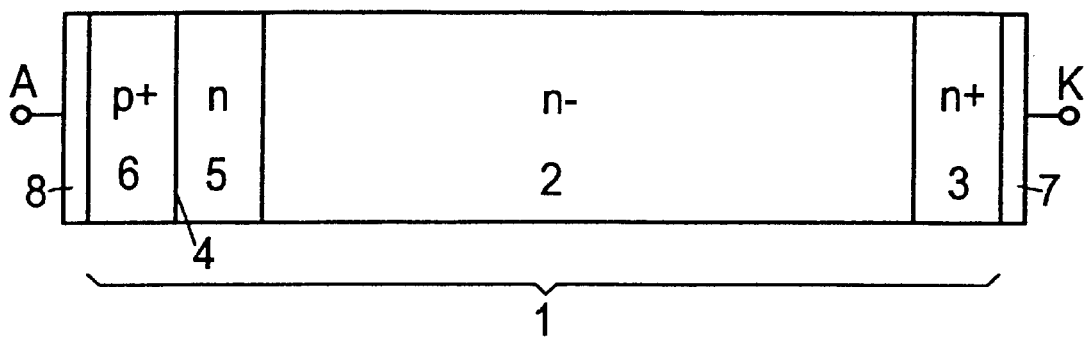
FIG. 1 is a diagrammatic, cross-sectional view through a semiconductor body of a pin power diode with space charge coupling (in a Read-diode version) of the prior art.

Referring now to the figures of the drawings in detail and first, particularly, to FIG. 1 thereof, there is seen a Read-diode which was originally developed as a high-frequency component for generating IMPATT oscillations. The FCI concept will be explained below in conjunction with FIG. 1, in terms of the known Read-diode in its special embodiment as a pin power diode. Such a Read-diode is known especially from FIG. 5 of the aforementioned publication by Kaschani et al.

The pin power diode in FIG. 1 has a semiconductor body 1. The semiconductor body 1 includes an $n^-$-doped inner zone 2. On the cathode side, an $n^+$-doped cathode zone 3 is disposed against the inner zone 2. The cathode zone 3 is connected through a cathode electrode 7 to a cathode terminal K. On the anode side, the inner zone 2 is adjoined by both an n-doped coupling zone 5 and a $p^+$-doped anode zone 6. On the anode side, the anode zone 6 is connected through the anode electrode 8 to the anode terminal A.

As FIG. 1 shows, the narrow coupling zone 5 has been introduced between the anode zone 6 and the inner zone 2 in the pin diode. The coupling zone 5 has the same conduction type as the inner zone 2 but is more highly doped than the inner zone 2. Due to that doping profile, the electrical field in the off-state mode is composed of a so-called high field zone and a so-called low field zone. The term "high field zone" relates to regions of high electrical field intensity, and the term "low field zone" relates to regions with a low electrical field.

While the high field zone is limited to the narrow area of the coupling zone 5 immediately preceding the anode zone 6, the low field zone extends homogeneously over the entire inner zone 2. However, depending on the magnitude of the doping, there is also a markedly higher resultant breakdown field strength in the high field zone than in the low field zone ($E_{BD,H} >> E_{BD,L}$).

In order to assure localized avalanche multiplication at the voltage breakdown, the pin diode is dimensioned in such a way that the field peak in the high field zone attains its breakdown field intensity $E_{BD,H}$ just at that time, while the field maximum in the low field zone is still far below its breakdown field intensity $E_{BD,L}$. If a breakdown voltage $V_{BD}$ is then exceeded, the initial result is charge carrier generation by avalanche multiplication only in the high field zone.

While the holes which are generated in that way immediately flow away at the adjacent $p^+$-doped anode zone 6, the electrons along the way to the $n^+$-doped cathode zone 3 must cross the entire space charge zone. The electrons move at saturation speed in the high field zone and because of their negative charge lead to a corresponding compensation of the space charges of the high field zone and the low field zone.

However, the effect of that compensation on the two zones differs. In the high field zone, a reduction in the field peak and a reduction in the avalanche multiplication occur, which in turn lead to a decrease in the electron flow, or in its compensating effect on the space charge there. Finally, regardless of the overvoltage being applied, the consequence of that negative feedback is stabilization of the field maximum near the breakdown field intensity $E_{BD,H}$.

The high field zone therefore is used both to further the requisite charge carriers and to perform the requisite localization of the avalanche multiplication. Conversely, in the low field zone, the increasing compensation of the space charge by the electron flow that increases with increasing overvoltage, leads to an increase in the gradient of the electrical field and thus to a corresponding increase in the electrical field, especially preceding the cathode zone 3.

The coupling of the electrical fields of the high field zone and the low field zone, in the pin power diode of FIG. 1, is effected through the space charge of the coupling zone 5. However, the space charge coupling has proved to be difficult to handle for the turnoff of power diodes, since as a rule the space charge coupling is very strongly temperature-dependent. It is accordingly difficult in practice to use such pin power diodes.

Figure 2:
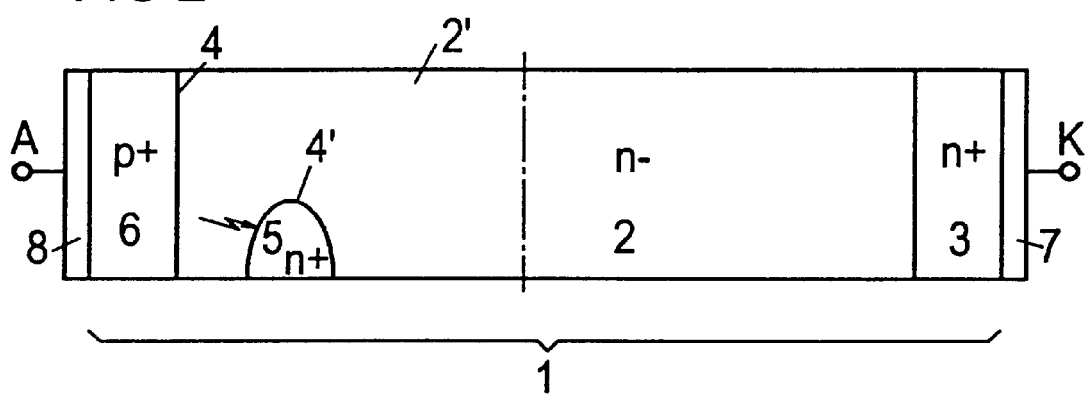
FIG. 2 is a cross-sectional view showing a first exemplary embodiment of a geometrically coupled FCI diode.

FIG. 2 shows a cross section through a semiconductor body 1 of a geometrically coupled FCI diode of the invention. Identical elements are identified by the same reference numerals as in FIG. 1.

The power diode in FIG. 2 essentially includes the elements of a pin power diode. The semiconductor body 1 includes an $n^-$-doped inner zone 2. On the cathode side, the $n^-$-doped inner zone 2 is adjoined by an $n^+$-doped cathode zone 3. The cathode zone 3 is connected through a cathode electrode 7 to a cathode terminal K. On the anode side, a $p^+$-doped anode zone 6 is connected to the $n^-$-doped inner zone 2. The anode zone 6 is connected through an anode electrode 8 to an anode terminal A.

According to the invention, an additional region with a higher dopant concentration than in the inner zone 2 is provided in an anode-side area 2' of the inner zone 2. This additional region is $n^+$-doped and will be referred to below as a floating region 5. In the present example, the floating region 5 is constructed as a buried layer.

The floating region 5 has the characteristic of a short circuit and is floating in terms of its potential. The high field cannot penetrate the floating region 5. The inner zone 2 is connected to the anode zone 6 through a pn junction 4. A boundary surface of the pn junction 4 between the inner zone 2 and the anode zone 6 is flat, that is it has no curves. The floating region 5 is not connected to the anode zone 6.

A highly nonhomogeneous dopant distribution on the anode side is created by introducing the buried floating region 5 into the inner zone 2. A locally highly variable distribution of the field lines of the electrical field results due to this nonhomogeneous dopant distribution in the anode-side region of the inner zone 2. In particular, the field lines of the electrical field are preferentially concentrated in regions of a boundary surface of an $n^+/n^-$ junction 4' between the floating region 5 and the inner zone 2 that have the most pronounced curvature. A breakdown occurs preferentially at this anode-side $n^+/n^-$ junction 4' of the floating region 5 to the inner zone 2. This is expressed in FIG. 2 and in the later drawing figures by a lightning symbol.

The floating region 5 can be created, for instance, by high-energy ion implantation in the form of a buried layer in the inner zone 2. Alternatively, it is also conceivable to etch a trench anisotropically into the anode-side surface of the semiconductor body 1. Subsequently, a masked $n^+$-diffusion is performed for generating the floating region 5.

Figure 3:
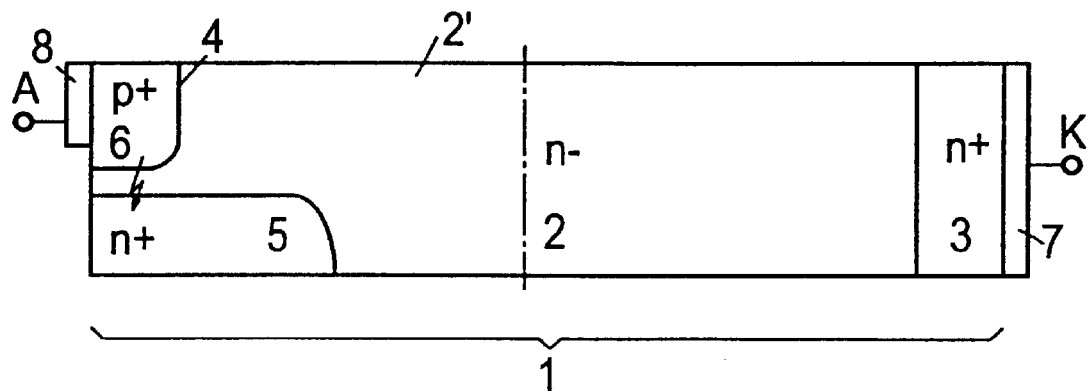
FIG. 3 is a cross-sectional view showing a second exemplary embodiment of a geometrically coupled FCI diode.

FIG. 3 shows a further exemplary embodiment of a geometrically coupled FCI diode. Elements which are identical to those in FIG. 2 are provided with the same reference numerals.

The FCI diode of FIG. 3 has essentially the same elements as the FCI diode of FIG. 2. However, in this case the $p^+$-doped anode zone 6 is not disposed as a continuous, homogeneous region on the front side of the semiconductor body 1. Instead, the boundary surface of the pn junction 4 has a curvature between the anode zone 6 and the inner zone 2. In addition, the floating region 5 is not constructed as a buried layer but rather directly adjoins the surface of the semiconductor body 1. The $n^+$-doped floating region 5 is spaced apart from the anode zone 6.

As in the exemplary of FIG. 2, the floating region 5 in this case as well causes a locally variable distribution of the dopant concentrations. The result is again a nonhomogeneous distribution of the field lines of the electrical field. The floating region 5 in FIG. 3 again acts as a short circuit, and as a result the breakdown occurs preferentially in the area immediately between the anode zone 6 and the floating region 5.

FIG. 4 shows a third exemplary embodiment of the geometrically coupled FCI diode of the invention. Elements that are identical to those of FIGS. 2 and 3 are provided with the same reference numerals.

FIG. 4 shows a further development of the geometrically coupled FCI of FIG. 3. In this case, the $n^+$-doped floating region 5 is no longer spaced apart from the anode zone 6. Instead, the floating region 5 partly borders on the anode zone 6. The breakdown therefore preferentially occurs at the pn junction 4 between the floating region 5 and the anode zone 6. In addition, the FCI diode of FIG. 4 has a trench 9 in the anode zone 6. The anode electrode 8 is disposed at the surface of the trench.

The trench 9 in FIG. 4 is especially advantageous in the production of the structures according to the invention. After the anisotropic etching of the trench 9, the anode zone 6 is created by masked diffusion. The surface of the trench is then covered over its entire surface with a typical metallizing. The metallizing then forms the anode electrode 8.

In FIGS. 2–4, the floating regions 5 have doping that is very much higher than the inner zone 2. Typically, the floating regions 5 have a dopant concentration of at least $10^{16}$ cm$^-$. Conversely, the inner zone 2 has a dopant concentration of at least $10^{15}$ cm$^{-3}$.

Since the floating regions 5 have a very high dopant concentration, they act as a short circuit with regard to their potentials. Due to this reason, it is also conceivable to replace the floating regions 5, instead of with very highly doped silicon, with some other good conducting material, such as polysilicon, metal silicide, or metal.

Only one floating region 5 is shown in each of FIGS. 2–4, by way of example. It is understood that a plurality of floating regions 5 may also be provided in the power semiconductor component.

FIG. 5 shows a fourth exemplary embodiment of the geometrically coupled FCI diode of the invention. As in the previous figures, identical elements are provided with the same reference numerals.

FIG. 5 shows a geometrically coupled FCI diode which has no floating region 5, in contrast to FIGS. 2–4. In this case, the function of the floating region 5 is replaced by the embodiment of the anode zone 6. The anode zone 6 in this case has regions that protrude in tanglike fashion into the semiconductor body 1. A pronounced curvature of the boundary surface of the pn junction 4 between the anode zone 6 and inner zone 2 is created through the use of these regions protruding in tanglike fashion into the semiconductor body 1. This curvature effects a local separation of the high field zone and the low field zone, in a manner similar to the examples of FIGS. 2–4. A breakdown of the electrical field in this case occurs preferentially in the areas of the most pronounced curvature of the pn junction. Typically, this is at the peak of the tanglike regions of the anode zone 6.

Trenches 9 which are provided in FIG. 5 similarly to FIG. 4, are especially advantageous from a production standpoint. The tanglike areas of the anode zone 6, in particular, can be produced in a simple way through the use of the trenches 9. Similarly to the example of FIG. 4, the trenches 9 are first anisotropically etched. Then the tanglike areas of the anode zone can be created, for instance through the use of a nonmasked diffusion.

FIG. 6 shows a refined geometrically coupled FCI diode corresponding to FIG. 2. Identical elements are identified by the same reference numerals as in the preceding drawing figures.

The FCI diode of FIG. 2 has been refined in FIG. 6 in such a way that a further $p^+$-doped zone 10 is provided between the cathode electrode 7 and the cathode zone 3, on the cathode side. An additional pn junction 12 is created by adding the additional zone 10 to the semiconductor body 1 of FIG. 2. In this way, a monolithically integrated semiconductor component can be made with two antiparallel, series-connected diodes.

Fundamentally, the creation of the additional pn junction 12 by inserting the additional zone 10 into the FCI diode of FIG. 2, ensures that the diode of the applicable newly created pn junction 12 is connected antiparallel and in series with the FCI diode. Moreover, care must be taken so that the breakdown voltage of the additional pn junction 12 is dimensioned to be high enough to prevent a flow of current in the conducting-state direction. For this reason, in the present example, the cathode zone 3 has lower doping than the further zone 10. Finally, care must be taken to ensure that the cathode zone 3 adjoining the further zone 10 is dimensioned to be wide enough so that a "punch through" of the cathode zone 3 will not occur. In that case, the blocking effect of the pn junction 4 would be invalidated.

Naturally, it is also conceivable to place the additional zone 10 on the anode side between the anode zone 6 and the anode electrode 8. The additional zone on the anode side would have to be $n^+$-doped in that case, and the anode zone 6 would have to be wide enough.

An additional pn junction for making two antiparallel-connected diodes can naturally also be created through the use of an anode-side or cathode-side Schottky contact instead of a further zone 10.

FIG. 7 shows a circuit diagram of an FCI hybrid diode, in the form of an advantageous use of the FCI diode of FIGS. 2–5. A parallel circuit including a diode $D_2$ and a diode $D_{FCI}$ is located between an anode terminal A and a cathode terminal K. The diode $D_2$ is, for example, a power diode optimized for good conducting-state performance. The FCI diode $D_{FCI}$ serves the function of a voltage suppressor and is operative only in the off-state mode. In the conducting-state mode, the diode $D_{FCI}$ is blocked by a diode $D_1$ that is connected in series with an antiparallel to it. Thus, in the conducting-state mode, the diode $D_2$ is relevant, while in the off-state mode the diode $D_{FCI}$ is relevant.

The diodes $D_1$, $D_2$, and $D_{FCI}$ can be constructed as a monolithically integrated semiconductor component. However, a discrete embodiment of the component is also conceivable. The advantages of a monolithically integrated configuration are a low-inductance construction, which in particular makes it possible to reduce switching losses.

The use of FCI diodes as freewheeling diodes or voltage suppressors in a parallel circuit with power semiconductor components that can be turned off, such as bipolar transistors, MOSFETs, IGBTs, GTOs, thyristors, MCTs, etc., is especially advantageous. In this case both a monolithic integration and a hybrid or discrete construction are conceivable.

Finally, one particular advantage of the invention is that the FCI diodes of the invention can also be constructed as simple diodes with a Read structure. This had not been possible until now, since such Read-diodes exhibit a very pronounced temperature dependency of their breakdown voltage. The reason for the strong temperature dependency of the breakdown voltage is the temperature dependency of the impact ionization, which occurs in the voltage breakdown inside the high field zone and which has an especially strong effect on the field intensity of the adjoining, markedly wider low field zone and thus on the breakdown voltage of the diode, because of the constant space charge in this high field zone. In order to circumvent this problem of space charge coupling, until now extremely complicated structures had been proposed, in which the field intensities of the high field zones and low field zones were coupled not through a constant space charge but rather by the utilization of the "punch-through" effect, or by such geometric effects as described above.

According to the invention, FCI diodes with a Read structure can be achieved through the dopant concentration in the $n^+$-doped cathode zone 3. It is thus possible to promote the tunnel effect at the pn junction between the p-doped anode zone 6 and the n-doped cathode zone 3, in a manner similar to low-power diodes, through the magnitude of the dopant concentration of the cathode zone 3.

Since the tunnel effect has a temperature coefficient that is opposed to the impact ionization, the temperature coefficient of the breakdown voltage of the FCI diode constructed as a Read-diode can be adjusted virtually arbitrarily, through the magnitude of the dopant concentration in the cathode zone 3. It can thus be expected that at a dopant concentration of the cathode zone 3 of approximately $10^{17}$ cm$^{-3}$, for instance, a breakdown voltage of the FCI diode in the form of a Read-diode can be established that has a weakly positive temperature coefficient. It is thus possible to avoid current filamentization and to assure reliable operation. However, the prerequisite for this is an anode zone 6 that has markedly higher doping than the cathode zone 3.

Through the use of the invention, it is thus possible in a technologically very simple way to construct an FCI diode in the very simple structure of a Read-diode. The temperature dependency of the breakdown voltage can be adjusted arbitrarily and accordingly compensated for as well.

We claim:

1. A power diode, comprising a semiconductor body, having:
   an inner zone of a first conduction type;
   a cathode zone of the first conduction type, said cathode zone adjoining said inner zone and having a higher dopant concentration than in said inner zone;

an anode zone of a second conduction type, said anode zone adjoining said inner zone and having a higher dopant concentration than in said inner zone; and at least one floating region of the first conduction type disposed in said inner zone, said at least one floating region has a higher dopant concentration than said inner zone.

2. The power diode according to claim 1, wherein said inner zone has an anode-side area, and said at least one floating region is disposed in said anode-side area.

3. The power diode according to 1, wherein said at least one floating region at least partly borders said anode zone.

4. The power diode according to claim 1, wherein said at least one floating region is formed of conductive material.

5. The power diode according to claim 4, wherein said at least one floating region is at least partly formed of highly-doped silicon.

6. The power diode according to claim 1, including a Read-diode structure.

7. A hybrid diode configuration, comprising a power diode including a semiconductor body, having:

an inner zone of a first conduction type;

a cathode zone of the first conduction type, said cathode zone adjoining said inner zone and having a higher dopant concentration than in said inner zone;

an anode zone of a second conduction type, said anode zone adjoining said inner zone and having a higher dopant concentration than in said inner zone; and at least one floating region of the first conduction type disposed in said inner zone, said at least one floating region has a higher dopant concentration than said inner zone.

8. A voltage limiter, comprising a power diode including a semiconductor body, having:

an inner zone of a first conduction type;

a cathode zone of the first conduction type, said cathode zone adjoining said inner zone and having a higher dopant concentration than in said inner zone;

an anode zone of a second conduction type, said anode zone adjoining said inner zone and having a higher dopant concentration than in said inner zone; and at least one floating region of the first conduction type disposed in said inner zone, said at least one floating region has a higher dopant concentration than said inner zone.

9. A freewheeling diode, comprising a power diode including a semiconductor body, having:

an inner zone of a first conduction type;

a cathode zone of the first conduction type, said cathode zone adjoining said inner zone and having a higher dopant concentration than in said inner zone;

an anode zone of a second conduction type, said anode zone adjoining said inner zone and having a higher dopant concentration than in said inner zone; and at least one floating region of the first conduction type disposed in said inner zone, said at least one floating region has a higher dopant concentration than said inner zone.

10. A power diode assembly, comprising a semiconductor body including:

a power diode having an inner zone of a first conduction type, a cathode zone of the first conduction type, said cathode zone adjoining said inner zone and having a higher dopant concentration than in said inner zone, an anode zone of a second conduction type, said anode zone adjoining said inner zone and having a higher dopant concentration than in said inner zone, and at least one floating region of the first conduction type disposed in said inner zone; and a power semiconductor component connected parallel to said power diode.

11. The power diode according to claim 1, wherein said at least one floating region and said anode zone defines an at least partly curved boundary surface therebetween.

12. The power diode according to claim 1, including a further boundary surface between said inner zone and said at least one floating region.

13. The power diode according to claim 1, wherein said at least one floating region is not connected to said anode zone.

14. A power diode, comprising a semiconductor body, having:

an inner zone of a first conduction type;

a cathode zone of the first conduction type, said cathode zone adjoining said inner zone and having a higher dopant concentration than in said inner zone;

an anode zone of a second conduction type, said anode zone adjoining said inner zone and having a higher dopant concentration than in said inner zone; and at least one floating region of the first conduction type disposed in said inner zone, said inner zone has an anode-side area, and said at least one floating region is disposed in said anode-side area.

15. The power diode according to claim 14, wherein said at least one floating region has a higher dopant concentration than said inner zone.

16. The power diode according to claim 14, wherein said at least one floating region at least partly borders said anode zone.

17. The power diode according to claim 14, wherein said at least one floating region is formed of conductive material.

18. The power diode according to claim 17, wherein said at least one floating region is at least partly formed of highly-doped silicon.

19. The power diode according to claim 14, including a Read-diode structure.

20. The power diode according to claim 14, wherein said at least one floating region has a higher dopant concentration than said inner zone and said anode zone defines an at least partly curved boundary surface therebetween.

21. The power diode according to claim 14, including a further boundary surface between said inner zone and said at least one floating region.

22. The power diode according to claim 14, wherein said at least one floating region is not connected to said anode zone.

23. A power diode, comprising a semiconductor body, having:

an inner zone of a first conduction type;

a cathode zone of the first conduction type, said cathode zone adjoining said inner zone and having a higher dopant concentration than in said inner zone;

an anode zone of a second conduction type, said anode zone adjoining said inner zone and having a higher dopant concentration than in said inner zone; and at least one floating region of the first conduction type disposed in said inner zone and at least partly borders said anode zone.

24. The power diode according to claim 23, wherein said at least one floating region has a higher dopant concentration than said inner zone.

25. The power diode according to claim 23, wherein said inner zone has an anode-side area, and said at least one floating region is disposed in said anode-side area.

26. The power diode according to claim 23, wherein said at least one floating region is formed of conductive material.

27. The power diode according to claim 26, wherein said at least one floating region is at least partly formed of highly-doped silicon.

28. The power diode according to claim 23, including a Read-diode structure.

29. The power diode according to claim 23, wherein said at least one floating region has a higher dopant concentration than said inner zone and said anode zone defines an at least partly curved boundary surface therebetween.

30. The power diode according to claim 23, including a further boundary surface between said inner zone and said at least one floating region.

31. The power diode according to claim 23, wherein said at least one floating region is not connected to said anode zone.

32. A power diode, comprising a semiconductor body, having:
    an inner zone of a first conduction type;
    a cathode zone of the first conduction type, said cathode zone adjoining said inner zone and having a higher dopant concentration than in said inner zone;
    an anode zone of a second conduction type, said anode zone adjoining said inner zone and having a higher dopant concentration than in said inner zone; and
    at least one floating region of the first conduction type disposed in said inner zone, said at least one floating region is formed of conductive material and is at least partly formed of highly-doped silicon.

33. The power diode according to claim 32, wherein said at least one floating region has a higher dopant concentration than said inner zone.

34. The power diode according to claim 32, wherein said inner zone has an anode-side area, and said at least one floating region is disposed in said anode-side area.

35. The power diode according to claim 32, wherein said at least one floating region at least partly borders said anode zone.

36. The power diode according to claim 32, including a Read-diode structure.

37. The power diode according to claim 32, wherein said at least one floating region has a higher dopant concentration than said inner zone and said anode zone defines an at least partly curved boundary surface therebetween.

38. The power diode according to claim 32, including a further boundary surface between said inner zone and said at least one floating region.

39. The power diode according to claim 32, wherein said at least one floating region is not connected to said anode zone.

40. A power diode, comprising a semiconductor body, having:
    an inner zone of a first conduction type;
    a cathode zone of the first conduction type, said cathode zone adjoining said inner zone and having a higher dopant concentration than in said inner zone;
    an anode zone of a second conduction type, said anode zone adjoining said inner zone and having a higher dopant concentration than in said inner zone;
    at least one floating region of the first conduction type disposed in said inner zone; and
    a further boundary surface between said inner zone and said at least one floating region.

41. The power diode according to claim 40, wherein said at least one floating region has a higher dopant concentration than said inner zone.

42. The power diode according to claim 40, wherein said inner zone has an anode-side area, and said at least one floating region is disposed in said anode-side area.

43. The power diode according to claim 40, wherein said at least one floating region at least partly borders said anode zone.

44. The power diode according to claim 40, wherein said at least one floating region is formed of conductive material.

45. The power diode according to claim 44, wherein said at least one floating region is at least partly formed of highly-doped silicon.

46. The power diode according to claim 40, including a Read-diode structure.

47. The power diode according to claim 40, wherein said at least one floating region has a higher dopant concentration than said inner zone and said anode zone defines an at least partly curved boundary surface therebetween.

48. The power diode according to claim 40, wherein said at least one floating region is not connected to said anode zone.

49. A power diode, comprising a semiconductor body, having:
    an inner zone of a first conduction type;
    a cathode zone of the first conduction type, said cathode zone adjoining said inner zone and having a higher dopant concentration than in said inner zone;
    an anode zone of a second conduction type, said anode zone adjoining said inner zone and having a higher dopant concentration than in said inner zone; and
    at least one floating region of the first conduction type disposed in said inner zone, said at least one floating region is not connected to said anode zone.

50. The power diode according to claim 49, wherein said at least one floating region has a higher dopant concentration than said inner zone.

51. The power diode according to claim 49, wherein said inner zone has an anode-side area, and said at least one floating region is disposed in said anode-side area.

52. The power diode according to claim 49, wherein said at least one floating region at least partly borders said anode zone.

53. The power diode according to claim 49, wherein said at least one floating region is formed of conductive material.

54. The power diode according to claim 53, wherein said at least one floating region is at least partly formed of highly-doped silicon.

55. The power diode according to claim 49, including a Read-diode structure.

56. The power diode according to claim 49, wherein said at least one floating region has a higher dopant concentration than said inner zone and said anode zone defines an at least partly curved boundary surface therebetween.

57. The power diode according to claim 49, including a further boundary surface between said inner zone and said at least one floating region.

58. A power diode, comprising a semiconductor body, having:
    an inner zone of a first conduction type;
    a cathode zone of the first conduction type, said cathode zone adjoining said inner zone and having a higher dopant concentration than in said inner zone;
    an anode zone of a second conduction type, said anode zone adjoining said inner zone and having a higher dopant concentration than in said inner zone; and
    at least one floating region of the first conduction type disposed in said inner zone, said at least one floating region and said anode zone defines an at least partly curved boundary surface therebetween.

59. A power diode, comprising a semiconductor body, having:

an inner zone of a first conduction type;

a cathode zone of the first conduction type, said cathode zone adjoining said inner zone and having a higher dopant concentration than in said inner zone;

an anode zone of a second conduction type, said anode zone adjoining said inner zone and having a higher dopant concentration than in said inner zone; and at least one floating region of the first conduction type disposed in said inner zone and formed of a conductive metal or metal silicide.

* * * * *